United States Patent [19]
Hill

[11] 3,731,116
[45] May 1, 1973

[54] HIGH FREQUENCY FIELD EFFECT TRANSISTOR SWITCH

[75] Inventor: Eugene R. Hill, Thousand Oaks, Calif.

[73] Assignee: The United States of America as represented by the Secretary of the Navy

[22] Filed: Mar. 2, 1972

[21] Appl. No.: 231,314

[52] U.S. Cl. .................................. 307/251, 307/279
[51] Int. Cl. .................................. H03k 17/60
[58] Field of Search .................. 307/205, 221, 251, 307/279, 304

[56] References Cited

UNITED STATES PATENTS

| | | | |
|---|---|---|---|
| 3,524,996 | 8/1970 | Raper | 307/251 |
| 3,495,097 | 2/1970 | Abramson | 307/304 |
| 3,412,266 | 11/1968 | Tarico | 307/304 |
| 3,386,053 | 5/1968 | Priddy | 307/251 |
| 3,378,779 | 4/1968 | Priddy | 307/251 |
| 3,521,087 | 7/1970 | Lombardi | 307/304 |
| 3,673,428 | 6/1972 | Athanas | 307/304 |
| 3,532,899 | 10/1970 | Huth | 307/251 |

*Primary Examiner*—John W. Huckert
*Assistant Examiner*—R. E. Hart
*Attorney*—Richard S. Sciascia et al.

[57] ABSTRACT

An improved field effect transistor (FET) switching circuit for sampling an analog input in response to a control pulse at extremely fast turn-on and turn-off times. the FET operating potential is obtained from a constant voltage source rather than the control signal. A diode is provided between the FET gate and the signal source and also a diode is provided between the FET gate and the control pulse source; the diodes retain sufficient stored charge to completely discharge the FET gate to channel capacitance during switching.

8 Claims, 4 Drawing Figures

HIGH FREQUENCY FIELD EFFECT TRANSISTOR SWITCH

BACKGROUND OF THE INVENTION

1. Field of the Invention

The invention relates to a field effect transistor switching circuit and particularly to a circuit for alternately connecting and disconnecting a high frequency signal source to an output load. Electronic switches with extremely fast turn-on and turn-off times are essential for construction of high performance sample-and-hold circuits, digital multipliers, and such devices. The need for higher data rates with increased accuracy places increasing demands upon electronic switching circuitry.

2. Description of Prior Art

Previously, a circuit such as shown in FIG. 1 was used for operating the FET switch. In addition to the field effect transistor (FET), the switch components include resistor $R_t$ and diode $D_1$. The switch is operated by the control voltage waveform ±E. The switch is open for −E control voltage and closed for +E control voltage. The input signal source $e_s$, source resistance $R_s$, output signal $e_o$, and load resistance $R_L$ are also shown in FIG. 1. The limitations and disadvantages of this circuit (FIG. 1) can be seen by examination of the equivalent circuit shown in FIG. 2 for the closed position of the switch, where diode $D_1$ is replaced by capacitor C which is equal to the capacitance of the inversely biased diode. The equivalent circuit of FIG. 2 also indicates that the FET can be replaced by its on-resistance $R_{on}$. The on-resistance of the FET remains constant provided the gate-to-channel voltage remains constant. Since the gate of the FET is tied through capacitor C to the fixed potential +E, the gate-to-channel voltage is a function of the input signal $e_s$. This results from the fact that resistance $R_t$ and capacitance C form a voltage divider which causes a modulation of the FET on-resistance $R_{on}$. For the N-channel FET switch, a positive going transition of the input signal $e_s$ can momentarily open the switch. As result of the modulation of $R_{on}$ by the input signal $e_s$, the output signal $e_o$ will not be an accurate representation of $e_s$.

Modulation of the FET on-resistance by the input signal which can occur for high frequency signals in the prior art circuit is prevented by the circuit of the present invention.

SUMMARY OF THE INVENTION

In the present invention, the operating potential for the FET is obtained from a positive supply voltage rather than from the input source, and a diode is provided between the FET gate and the input source. A diode is also provided between the FET gate and the positive supply voltage. The diodes retain sufficient stored charge to completely discharge the FET gate to channel capacitance during switching for faster switching times. This invention allows the application of high frequency input signals without modulation of the FET on-resistance, and even large amplitude step functions will not cause momentary opening of the switch.

Other objects, advantages and novel features of the invention will become apparent from the following detailed description of the invention when considered in conjunction with the accompanying drawings wherein.

Figure 1:
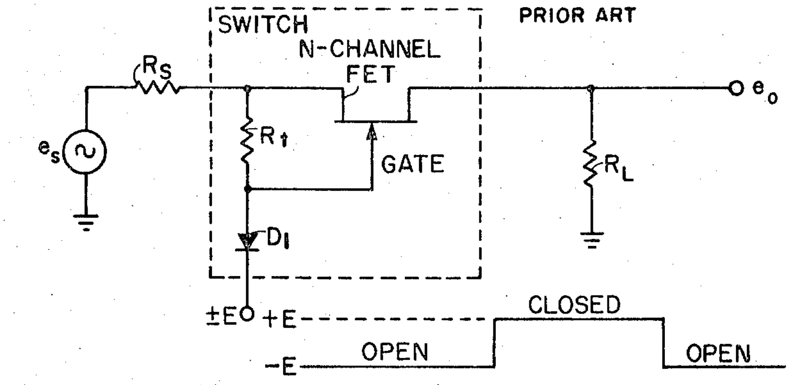
FIG. 1 shows a prior art circuit for operating a FET switch.

Referring to the drawing, like references refer to similar components in each of the figures.

Figure 2:
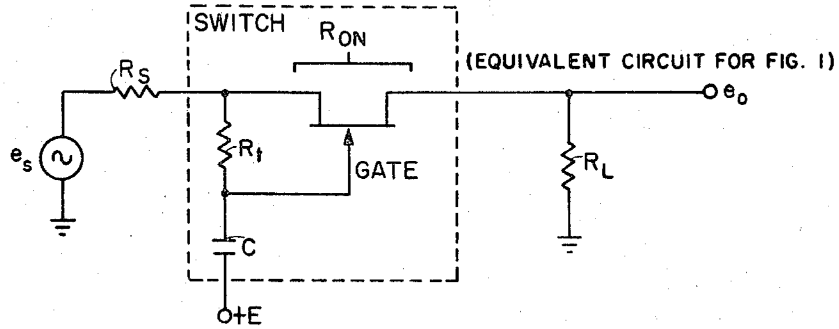
FIG. 2 is the equivalent circuit for the closed switch position for the circuit of FIG. 1.

The prior art circuit has been considered in the discussion of FIGS. 1 and 2 above.

DESCRIPTION OF THE PREFERRED EMBODIMENTS

Figure 3:
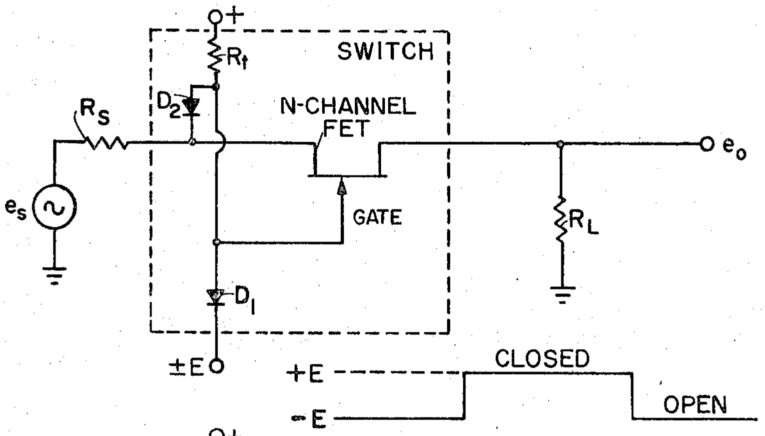
FIG. 3 shows a preferred embodiment for the improved FET switch circuit of the present invention.

The improved circuit for the FET switch is shown in FIG. 3. This circuit differs from the prior art circuit in several respects.

In the improved circuit resistor $R_t$ is connected to a positive supply voltage rather than to the input source $e_s$. Also, a diode $D_2$ has been added between the gate of the FET and the signal source $e_s$.

In the open state of the switch, when the cathode of diode $D_1$ is connected to negative control voltage −E, diode $D_2$ will be back biased and the current flowing in resistor $R_t$ will flow through diode $D_1$.

In the closed state of the switch, when the cathode of diode $D_1$ is connected to positive control voltage +E, diode $D_1$ will be back biased and the current flowing in resistor $R_t$ will flow through diode $D_2$.

The minority carrier signal stored charge in diode $D_1$ should be sufficient to discharge the capacitance of diode $D_2$ and the gate-to-channel capacitance of the FET when the cathode of diode $D_1$ is switched from a negative control voltage −E to a positive control voltage +E. Under these conditions, the delay in closing the FET switch is limited only by the transition time from −E to +E of the control voltage. The minority carrier signal stored charge in diode $D_2$, with the cathode of diode $D_1$ at +E, should be sufficient to charge and discharge the capacitance of diode $D_1$ for the maximum amplitude of the input signal $e_s$.

While stored carriers are important in both diodes $D_1$ and $D_2$, the functions of each diode are different and are operative at different times. The carriers stored in diode $D_1$ during the open state of the switch perform the function of rapidly discharging the gate-to-channel capacitance as the switch is closed. The carriers stored in diode $D_2$ during the closed state of the switch serve to clamp the gate of the FET to the signal source and thus maintain the FET on-resistance constant. The stored charge in diode $D_2$ is continuously maintained by current through resistor $R_t$ as long as the switch is in the closed state. The stored carriers in diode $D_1$ are functional only during the switch closing transient period.

This FET switch is of the type used in copending U.S. Pat. application, Ser. No. 231,310 filed Mar. 2, 1972, for "SAMPLE-AND-HOLD CIRCUIT."

The complementary circuit to that shown in FIG. 3 can also be constructed using a P-channel FET in place of the N-channel FET with the necessary changes in diode, supply voltage and control signal polarities.

Figure 4:
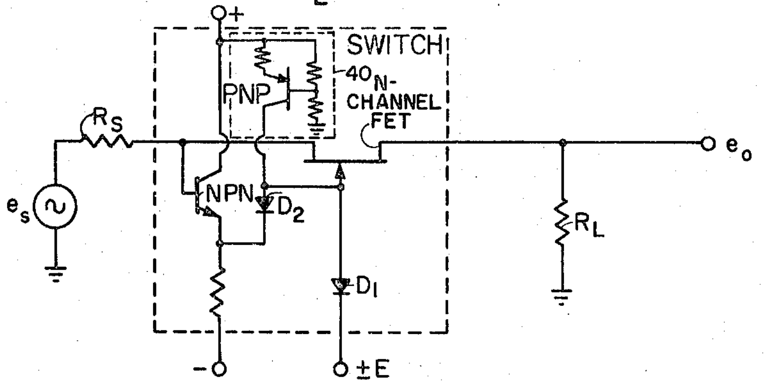
FIG. 4 illustrates another embodiment of the present invention.

The circuit can be improved further with some small additional complexity. For example, resistor $R_t$ can be replaced with a current source, such as the circuit shown in the dashed box 40 in FIG. 4, for example, using a PNP transistor. Such a current source will maintain a constant current in diode $D_2$ (i.e., independent of the input signal $e_s$) with better control of the minority carrier signal stored charge in diode $D_2$. The current source 40 will also eliminate any attenuation resulting from use of a resistor for $R_t$. The current flowing in diode $D_2$ also flows into source resistance $R_s$ and load resistance $R_L$. If necessary or desired, this current flow in resistances $R_s$ and $R_L$ can also be greatly reduced by the addition of an NPN transistor as is also shown in FIG. 4.

What is claimed is:

1. A high frequency field effect transistor switching device including in combination, a. a field effect transistor having a channel input electrode, a channel output electrode and a gate electrode, b. a control voltage source for providing a switching voltage, c. a first diode connected between said gate electrode and said control voltage source, d. resistor means connected between said gate electrode and a positive supply voltage, e. a second diode connected between said gate electrode and said channel input electrode, f. signal charges stored in said first diode during the open state of said field effect transistor rapidly discharging the gate-to-channel capacitance of the field effect transistor as it is switched to the closed state, g. signal charges stored in said second diode during the closed state of the field effect transistor serving to clamp the gate of the field effect transistor to the signal at the channel input electrode for maintaining the on-resistance of the field effect transistor constant, the stored charges in said second diode being maintained by current through said resistor means as long as said field effect transistor is in its closed state, wherein high frequency input signals can be applied to said input electrode without modulation of the field effect transistor on-resistance or causing momentary opening of the switching device.

2. A switching device as in claim 1 wherein said field effect transistor is an N-channel field effect transistor.

3. A switching device as in claim 1 wherein said field effect transistor is a P-channel field effect transistor.

4. A high frequency field effect transistor switching device including in combination, a. a field effect transistor having a channel input electrode, a channel output electrode and a gate electrode, b. a control voltage source for providing a switching voltage, c. a first diode connected between said gate electrode and said control voltage source, d. a second diode connected between said gate electrode and said channel input electrode, e. a current source means connected between said gate electrode and a positive supply voltage for maintaining a constant current in said second diode, f. signal charges stored in said first diode during the open state of said field effect transistor rapidly discharging the gate-to-channel capacitance of the field effect transistor as it is switched to the closed state, g. signal charges stored in said second diode during the closed state of the field effect transistor serving to clamp the gate of the field effect transistor to the signal at the channel input electrode for maintaining the on-resistance of the field effect transistor constant, the stored charges in said second diode being maintained by current through said current source means as long as said field effect transistor is in its closed state, wherein high frequency input signals can be applied to said input electrode without modulation of the field effect transistor on-resistance or causing momentary opening of the switching device.

5. A switching device as in claim 4 wherein said field effect transistor is an N-channel field effect transistor.

6. A switching device as in claim 4 wherein said field effect transistor is a P-channel field effect transistor.

7. A switching device as in claim 4 wherein current control means is connected between said second diode and said channel input electrode.

8. A switching device as in claim 7 wherein said current control means is a transistor.

* * * * *